(12) United States Patent
Chang et al.

(10) Patent No.: US 9,136,476 B2
(45) Date of Patent: Sep. 15, 2015

(54) METHOD OF MANUFACTURING ORGANIC LIGHT-EMITTING DISPLAY APPARATUS, AND ORGANIC LIGHT-EMITTING DISPLAY APPARATUS MANUFACTURED BY THE METHOD

(71) Applicant: Samsung Display Co., Ltd., Yongin, Gyeonggi-Do (KR)

(72) Inventors: Yun-Ho Chang, Yongin (KR); Mi-Joo Yoon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 139 days.

(21) Appl. No.: 13/946,945

(22) Filed: Jul. 19, 2013

(65) Prior Publication Data
US 2014/0284561 A1    Sep. 25, 2014

(30) Foreign Application Priority Data

Mar. 20, 2013  (KR) .................. 10-2013-0029910

(51) Int. Cl.
 *H01L 21/00* (2006.01)
 *H01L 51/00* (2006.01)
 *H01L 27/32* (2006.01)
(52) U.S. Cl.
 CPC ........ *H01L 51/0012* (2013.01); *H01L 27/3248* (2013.01); *H01L 51/0011* (2013.01); *H01L 27/3244* (2013.01)
(58) Field of Classification Search
 CPC ............ H01L 51/0012; H01L 51/0011; H01L 27/3248; H01L 27/3244
 See application file for complete search history.

(56) References Cited

U.S. PATENT DOCUMENTS

| 6,274,198 | B1 | 8/2001 | Dautartas |
| 6,371,451 | B1 | 4/2002 | Choi |
| 6,579,422 | B1 | 6/2003 | Kakinuma |
| 6,749,906 | B2 | 6/2004 | Van Slyke |
| 8,852,687 | B2 * | 10/2014 | Chang et al. .................. 427/294 |
| 8,962,360 | B2 * | 2/2015 | Chang et al. .................... 438/28 |
| 2001/0006827 | A1 | 7/2001 | Yamazaki et al. |
| 2001/0026638 | A1 | 10/2001 | Sangu et al. |
| 2002/0076847 | A1 | 6/2002 | Yamada et al. |
| 2002/0168577 | A1 | 11/2002 | Yoon |
| 2003/0101937 | A1 | 6/2003 | Van Slyke et al. |
| 2003/0168013 | A1 | 9/2003 | Freeman et al. |

(Continued)

FOREIGN PATENT DOCUMENTS

| EP | 1 413 644 A2 | 4/2004 |
| EP | 1 418 250 A2 | 5/2004 |

(Continued)

OTHER PUBLICATIONS

Machine English Translation of JP 2001-052862, 20 pages.

(Continued)

*Primary Examiner* — Laura Menz
(74) *Attorney, Agent, or Firm* — Christie, Parker & Hale, LLP

(57) ABSTRACT

A method of manufacturing an organic light emitting display apparatus, and an organic light emitting display apparatus manufactured by the method, the method being suitable for mass producing a large substrate, enabling high-definition patterning, and allowing controlling of a distance between a patterning slit sheet and a substrate which are moved relative to each other.

13 Claims, 14 Drawing Sheets

(56) References Cited

U.S. PATENT DOCUMENTS

| | | |
|---|---|---|
| 2003/0221614 A1 | 12/2003 | Kang et al. |
| 2003/0232563 A1 | 12/2003 | Kamiyama et al. |
| 2004/0029028 A1 | 2/2004 | Shimizu |
| 2004/0086639 A1 | 5/2004 | Grantham et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2004/0195530 A1 | 10/2004 | Kwak et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0153472 A1 | 7/2005 | Yotsuya |
| 2005/0166842 A1 | 8/2005 | Sakamoto |
| 2006/0011136 A1 | 1/2006 | Yamazaki et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2007/0077358 A1 | 4/2007 | Jeong et al. |
| 2007/0178708 A1 | 8/2007 | Ukigaya |
| 2007/0231460 A1 | 10/2007 | Ukigaya |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0229524 A1 | 9/2009 | Kim et al. |
| 2009/0232976 A1 | 9/2009 | Yoon et al. |
| 2010/0297349 A1 | 11/2010 | Lee et al. |
| 2012/0009328 A1 | 1/2012 | Ryu et al. |
| 2012/0145077 A1* | 6/2012 | Chang et al. ................. 118/712 |
| 2013/0009177 A1* | 1/2013 | Chang et al. ................... 257/88 |
| 2014/0084262 A1* | 3/2014 | Kim ............................... 257/40 |
| 2014/0284561 A1* | 9/2014 | Chang et al. ................... 257/40 |
| 2014/0291618 A1* | 10/2014 | Na et al. ........................ 257/40 |
| 2014/0291619 A1* | 10/2014 | Lee et al. ....................... 257/40 |
| 2014/0370633 A1* | 12/2014 | Chang et al. ................... 438/46 |

FOREIGN PATENT DOCUMENTS

| | | |
|---|---|---|
| EP | 1 518 940 A1 | 3/2005 |
| JP | 04-272170 A | 9/1992 |
| JP | 08-027568 A | 1/1996 |
| JP | 2000-068054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-197531 A | 7/2003 |
| JP | 2003-297562 A | 10/2003 |
| JP | 2004-035964 A | 2/2004 |
| JP | 2004-043898 A | 2/2004 |
| JP | 2004-76150 A | 3/2004 |
| JP | 2004-103269 A | 4/2004 |
| JP | 2004-103341 A | 4/2004 |
| JP | 2004-137583 A | 5/2004 |
| JP | 2004-199919 A | 7/2004 |
| JP | 2005-044592 A | 2/2005 |
| JP | 2005-206939 A | 8/2005 |
| JP | 2005-235568 A | 9/2005 |
| JP | 2005-293968 A | 10/2005 |
| JP | 2005-296737 A | 10/2005 |
| JP | 3705237 B2 | 10/2005 |
| JP | 2006-028583 A | 2/2006 |
| JP | 2006-172930 A | 6/2006 |
| JP | 2006-176809 A | 7/2006 |
| JP | 2006-275433 A | 10/2006 |
| JP | 2006-292955 A | 10/2006 |
| JP | 2007-047293 A | 2/2007 |
| JP | 2007-291506 A | 11/2007 |
| JP | 2008-121098 A | 5/2008 |
| JP | 2009-019243 A | 1/2009 |
| JP | 2009-024208 A | 2/2009 |
| JP | 2009-081165 A | 4/2009 |
| JP | 2009-087910 A | 4/2009 |
| JP | 2010-261081 A | 11/2010 |
| KR | 10-2000-0019254 A | 4/2000 |
| KR | 10-1997-0054303 B1 | 5/2000 |
| KR | 10-2000-0023929 A | 5/2000 |
| KR | 10-2001-0059939 A | 7/2001 |
| KR | 10-2001-0093666 A | 10/2001 |
| KR | 10-2002-0000201 A | 1/2002 |
| KR | 10-2002-0050922 A | 6/2002 |
| KR | 10-2002-0090934 A | 12/2002 |
| KR | 10-2003-0034730 A | 5/2003 |
| KR | 10-0405080 B1 | 11/2003 |
| KR | 10-2003-0091947 A | 12/2003 |
| KR | 10-2003-0093959 A | 12/2003 |
| KR | 10-2004-0014258 A | 2/2004 |
| KR | 10-2004-0034537 A | 4/2004 |
| KR | 2004-0050045 A | 6/2004 |
| KR | 2004-0069281 A | 8/2004 |
| KR | 10-2004-0084747 A | 10/2004 |
| KR | 10-2004-0087142 A | 10/2004 |
| KR | 10-0463212 B1 | 12/2004 |
| KR | 10-0520159 B1 | 10/2005 |
| KR | 10-2006-0008602 A | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104288 A | 10/2006 |
| KR | 10-2006-0104675 A | 10/2006 |
| KR | 10-2006-0104677 A | 10/2006 |
| KR | 10-2006-0109627 A | 10/2006 |
| KR | 10-2006-0114462 A | 11/2006 |
| KR | 10-0646160 B1 | 11/2006 |
| KR | 10-2006-0123944 A | 12/2006 |
| KR | 10-0687007 B1 | 2/2007 |
| KR | 10-2007-0025164 A | 3/2007 |
| KR | 10-0696547 B1 | 3/2007 |
| KR | 10-0696550 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-0787457 B1 | 12/2007 |
| KR | 10-2008-0001184 A | 1/2008 |
| KR | 10-2008-0003720 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-2008-0044775 A | 5/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0061774 A | 7/2008 |
| KR | 10-2008-0062212 A | 7/2008 |
| KR | 10-2009-0038733 A | 4/2009 |
| KR | 10-2009-0097453 A | 9/2009 |
| KR | 10-2010-0099806 A | 9/2010 |
| KR | 10-2010-0126125 A | 12/2010 |

(56) References Cited

FOREIGN PATENT DOCUMENTS

| KR | 10-2012-0006324 A | 1/2012 |
|---|---|---|
| KR | 10-2012-0065789 A | 6/2012 |

OTHER PUBLICATIONS

Machine English Translation of JP 2003-003250, 25 pages.
Machine English Translation of JP 2009-024208, 30 pages.
Korean Office action dated Aug. 1, 2011 for corresponding Korean Patent No. 10-2009-0074001, 3 pages.
Korean Office action dated Feb. 1, 2012 for corresponding Korean Patent No. 10-2010-0014272, 4 pages.
Korean Office action dated Feb. 6, 2012 for corresponding Korean Patent No. 10-2010-0021835, 4 pages.
Korean Office action dated Apr. 2, 2012 for corresponding Korean Patent No. 10-2010-0066993, 4 pages.
KIPO Registration Determination Certificate dated Aug. 24, 2012, for Korean Patent application 10-2010-0066993, 5 pages.
Korean Patent Abstracts, Publication No. 10-0257219 B1, dated Feb. 29, 2000, for corresponding Korean Patent No. 10-1997-0054303 B1, 2 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
English Abstract, Publication No. 10-2008-0002189 A, dated Jan. 4, 2008, for corresponding Korean Patent No. 10-0800125, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.

\* cited by examiner

METHOD OF MANUFACTURING ORGANIC LIGHT-EMITTING DISPLAY APPARATUS, AND ORGANIC LIGHT-EMITTING DISPLAY APPARATUS MANUFACTURED BY THE METHOD

CROSS-REFERENCE TO RELATED PATENT APPLICATION

This application claims priority to and the benefit of Korean Patent Application No. 10-2013-0029910, filed on Mar. 20, 2013, in the Korean Intellectual Property Office, the entire content of which is incorporated herein by reference.

BACKGROUND

1. Field

Aspects of the present invention relate to a method of manufacturing an organic light-emitting display apparatus, and an organic light-emitting display apparatus manufactured by the method.

2. Description of the Related Art

Organic light-emitting display apparatuses have wider viewing angles, better contrast characteristics, and faster response speeds than other display apparatuses, and thus, have drawn attention as the next-generation of display apparatuses.

An organic light-emitting display apparatus includes intermediate layers (including an emission layer) disposed between a first electrode and a second electrode. The electrodes and the intermediate layers may be formed using various methods such as a deposition method using a fine metal mask (FMM). In this case, a FMM having the same pattern as that of a deposition layer to be formed is disposed to closely contact a substrate on which the deposition layer is to be formed, and a deposition material is deposited on the FMM to form the deposition layer having the desired pattern.

However, the deposition method using such an FMM presents difficulties in manufacturing larger organic light-emitting display apparatuses that use a large mother glass (substrate). For example, when such a large mask is used with the large mother glass, the mask may bend due to gravity, thereby distorting a pattern of a deposition layer. Such disadvantages are not conducive to the recent trend for forming high-definition patterns.

Moreover, processes of aligning a substrate and an FMM to closely contact each other, performing deposition thereon, and separating the FMM from the substrate are time-consuming, thereby resulting in a long manufacturing time and low yield.

SUMMARY

According to aspects of the present invention, methods of manufacturing organic light emitting display apparatuses are suitable for mass producing large substrates, enabling high-definition patterning, and allowing control of distances between a patterning slit sheet and a substrate which are moving relative to each other, and organic light-emitting display apparatuses manufactured by the methods.

According to an embodiment of the present invention, a method of manufacturing an organic light emitting display apparatus includes: fixing a substrate to a transfer unit at a loading unit; transporting the transfer unit on which the substrate is fixed in a first direction into a chamber by using a first conveyer unit that passes through the chamber; depositing a deposition material that is emitted from a deposition assembly by relatively moving the substrate with respect to the deposition assembly, while the deposition assembly disposed in the chamber and the substrate are separated from each other in a distance; separating the substrate on which deposition is completed from the transfer unit at an unloading unit; and transporting the transfer unit that is separated from the substrate to the loading unit by using a second conveyer unit, wherein the depositing of the deposition material includes measuring an interval between the substrate and the deposition assembly while the substrate relatively moves with respect to the deposition assembly.

Additional deposition assemblies may be disposed in the chamber so as to perform deposition on the substrate consecutively.

The transfer unit may be circulated by the first conveyer unit and the second conveyer unit.

One of the first conveyer unit and the second conveyer unit may be disposed on top of the other.

A patterning slit sheet of the deposition assembly may be smaller than the substrate in at least one of the first direction and a second direction perpendicular to the first direction.

The deposition assembly may include: a deposition source configured to discharge the deposition material; a deposition source nozzle unit installed at a side of the deposition source and including a plurality of deposition source nozzles; a patterning slit sheet facing the deposition source nozzle unit and including a plurality of patterning slits formed along a direction; and an interval measuring assembly configured to move relatively with respect to a substrate and the patterning slit sheet in order to measure an interval between the substrate and the patterning slit sheet, wherein the patterning slit sheet includes a patterning unit having a plurality of patterning slits and a non-patterning unit that surrounds the patterning unit and has no patterning slit, and wherein the interval measuring assembly includes at least three interval measuring units, and positions where the at least three interval measuring units are disposed are located on a single virtual plane, and the points at which the interval measuring units are disposed are not arranged along a straight line.

The at least three interval measuring units may include a first interval measuring unit, a second interval measuring unit, and a third interval measuring unit, wherein virtual lines that connect the locations where the first interval measuring unit, the second interval measuring unit, and the third interval measuring unit are located form a triangle, and while the first interval measuring unit, the second interval measuring unit, and the third interval measuring unit move in a first direction or in a third direction opposite the first direction, the virtual lines that connect the locations where the first interval measuring unit, the second interval measuring unit, and the third interval measuring unit are disposed form a triangle.

The measuring of the interval may include, when the substrate is transported in the first direction such that a side portion of the substrate is located on the non-patterning unit: measuring a distance with respect to the substrate and a distance with respect to the patterning slit sheet while the first interval measuring unit, the second interval measuring unit, and the third interval measuring unit are located above a portion of the substrate corresponding to the non-patterning unit, so as to calculate intervals between the substrate and the patterning slit sheet at each of the locations where the first interval measuring unit, the second interval measuring unit, and the third interval measuring unit are located; and when there is a difference in the intervals between the patterning slit sheet and the substrate at each of the positions where the first interval measuring unit, the second interval measuring unit, and the third interval measuring unit are located, moving the patterning slit sheet such that the intervals become identical.

The measuring of the interval may include, when the substrate is transported in the first direction so that the side portion of the substrate passes above the patterning unit: calculating an interval between the substrate and the patterning slit sheet by using the second interval measuring unit moving at the same speed as a transportation speed of the substrate in the first direction to measure distances of the second interval measuring unit with respect to the substrate and the patterning slit sheet; and when there is a difference in intervals between the substrate and the patterning slit sheet at each of the positions where the first interval measuring unit, the second interval measuring unit, and the third interval measuring unit are located, moving the patterning slit sheet such that the intervals become identical.

The first interval measuring unit and the third interval measuring unit may be stationary above the non-patterning unit to measure respective distances of the first interval measuring unit and the third interval measuring unit with respect to the substrate and the patterning slit sheet to calculate intervals between the substrate and the patterning slit sheet.

The measuring of an interval may include, when the substrate is transported in the first direction so that the side portion of the substrate passes above the patterning unit and the non-patterning unit to be out of the non-patterning unit: calculating intervals between the substrate and the patterning slit sheet by measuring respective distances of the first, second, and third interval measuring units with respect to the substrate and the patterning slit sheet, the second interval unit being stationary above a portion of the non-patterning unit adjacent to a first side portion of the substrate with respect to the patterning unit, and the first interval measuring unit and the third interval measuring unit being stationary above portions of the non-patterning unit adjacent to a second side portion of the substrate with respect to the patterning unit; and when there is a difference in intervals between the substrate and the patterning slit sheet at each of the portions where the first interval measuring unit, the second interval measuring unit, and the third interval measuring unit are located, moving the patterning slit sheet such that the intervals become identical.

The measuring of an interval may include, when the substrate is transported in the first direction so that a portion of the patterning slit sheet does not correspond to the substrate: calculating intervals between the substrate and the patterning slit sheet by measuring respective distances of the first, second, and third interval measuring units with respect to the substrate and the patterning slit sheet, the second interval unit being stationary above a portion of the non-patterning unit adjacent to a first side portion of the substrate with respect to the patterning unit, and the first interval measuring unit and the third interval measuring moving in the first direction as the same speed as a transportation speed of the substrate; and when there is a difference in intervals between the substrate and the patterning slit sheet at each of the portions where the first interval measuring unit, the second interval measuring unit, and the third interval measuring unit are located, moving the patterning slit sheet such that the intervals become identical.

According to another embodiment of the present invention, an organic light-emitting display apparatus includes: a substrate; a thin film transistor disposed on the substrate and including a semiconductor active layer, a gate electrode insulated from the semiconductor active layer, and source and drain electrodes each contacting the semiconductor active layer; a plurality of pixel electrodes disposed on the thin film transistor; a plurality of deposition layers disposed on the plurality of the pixel electrodes; and a counter electrode formed on the plurality of deposition layers, wherein a length of a hypotenuse of at least one of the plurality of deposition layers on the substrate farther from a center of a deposition region is larger than lengths of hypotenuses of other deposition layers formed closer to the center of the deposition region, and wherein the at least one of the plurality of deposition layers on the substrate is a linearly-patterned deposition layer formed by using the method described above.

BRIEF DESCRIPTION OF THE DRAWINGS

The above and other features and advantages of the present invention will become more apparent by describing in more detail some example embodiments thereof with reference to the attached drawings in which.

DETAILED DESCRIPTION

Figure 1:
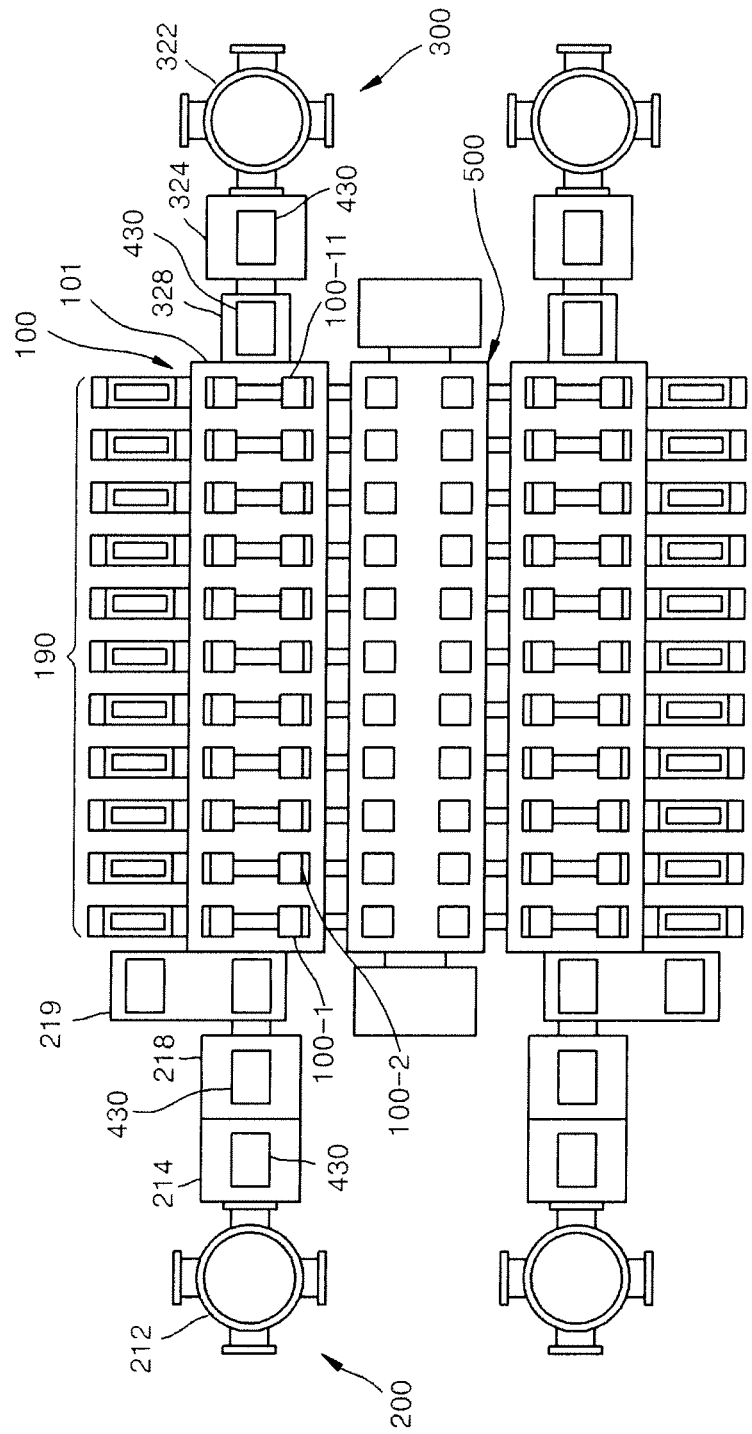
FIG. 1 is a schematic plan view illustrating a structure of a deposition apparatus according to an embodiment of the present invention.

Reference will now be made in more detail to some embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
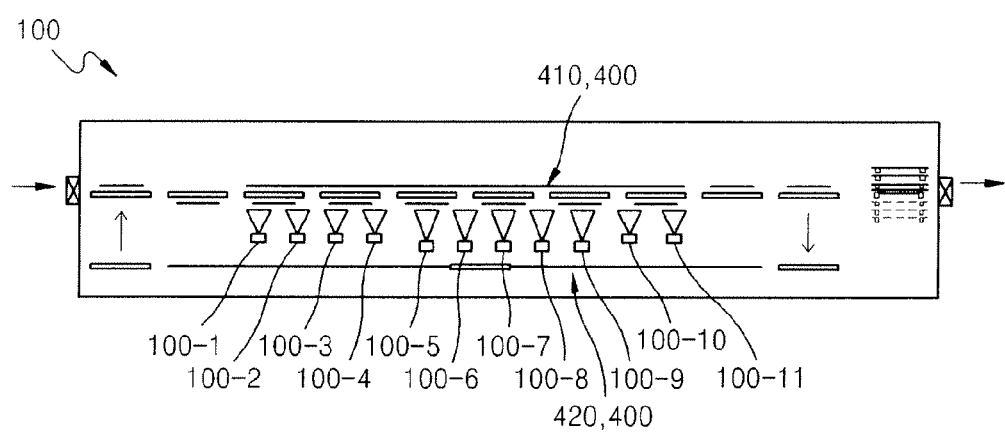
FIG. 2 is a schematic side view of a deposition unit of the deposition apparatus of FIG. 1, according to an embodiment of the present invention.

FIG. 1 is a schematic plan view illustrating a structure of a deposition apparatus according to an embodiment of the present invention. FIG. 2 is a schematic side view of a deposition unit 100 of the deposition apparatus of FIG. 1, according to an embodiment of the present invention.

Referring to FIGS. 1 and 2, the deposition apparatus includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been deposited are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, which is separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of deposition assemblies 100-1, 100-2, . . . 100-n may be disposed. Referring to FIG. 1, 11 deposition assemblies, i.e., a first deposition assembly 100-1, a second deposition assembly 100-2, . . . and an eleventh deposition assembly 100-11, are disposed in the chamber 101, but the number of deposition assemblies may vary with the deposition material and deposition conditions. The chamber 101 is maintained in vacuum during the deposition process.

In the embodiment illustrated in FIG. 1, the transfer unit 430 with the substrate 2 fixed thereon may be moved at least to the deposition unit 100 or may be moved sequentially by the first conveyer unit 410 to the loading unit 200, the deposition unit 100, and the unloading unit 300, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the deposition apparatus is configured such that one of the first conveyer unit 410 and the second conveyer unit 420 is disposed in upper portion of the other so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed above or below the first conveyer unit 410, and accordingly, the deposition apparatus may have an improved space utilization efficiency.

In an embodiment, the deposition unit 100 of FIG. 1 may further include a deposition source replacement unit 190 disposed at a side of each deposition assembly. Although not particularly illustrated in the drawings, the deposition source replacement unit 190 may be a cassette-type unit that may be taken out completely from each deposition assembly. Thus, a deposition source 110 (refer to FIG. 3) of the deposition assembly 100-1 may be easily replaced.

FIG. 1 illustrates the deposition apparatus in which two sets of structures each including the loading unit 200, the deposition unit 100, the unloading unit 300, and the conveyer unit 400 are arranged in parallel. That is, it can be seen that two deposition units 100 are respectively arranged at opposite sides of the deposition apparatus in upper and lower portions of FIG. 1. In such an embodiment, a patterning slit sheet replacement unit 500 may be disposed between the two deposition units 100. That is, due to this configuration of structures, the two deposition units 100 share the patterning slit sheet replacement unit 500, which results in improved space utilization efficiency as compared to a case where each deposition units 100 includes the patterning slit sheet replacement unit 500.

Figure 3:
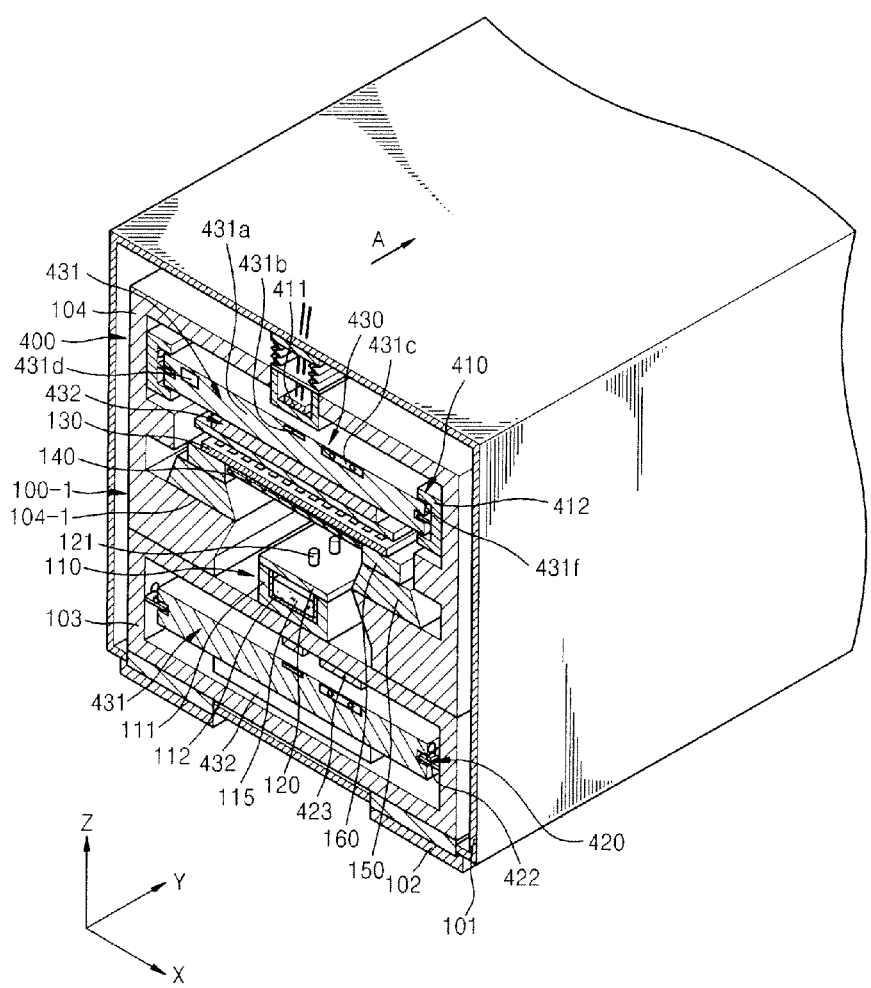
FIG. 3 is a schematic perspective view of the deposition unit of the deposition apparatus of FIG. 1, according to an embodiment of the present invention.
Figure 4:
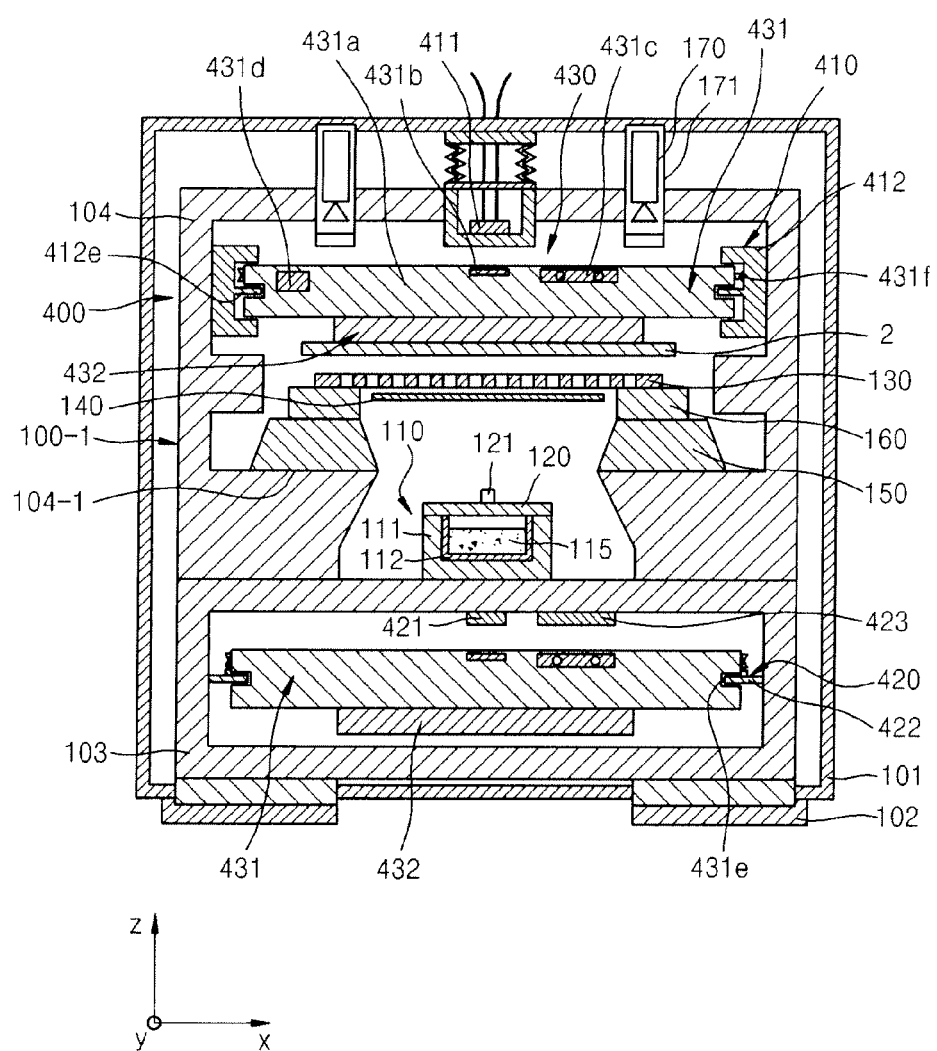
FIG. 4 is a schematic cross-sectional view of the deposition unit of FIG. 3, according to an embodiment of the present invention.
Figure 5:
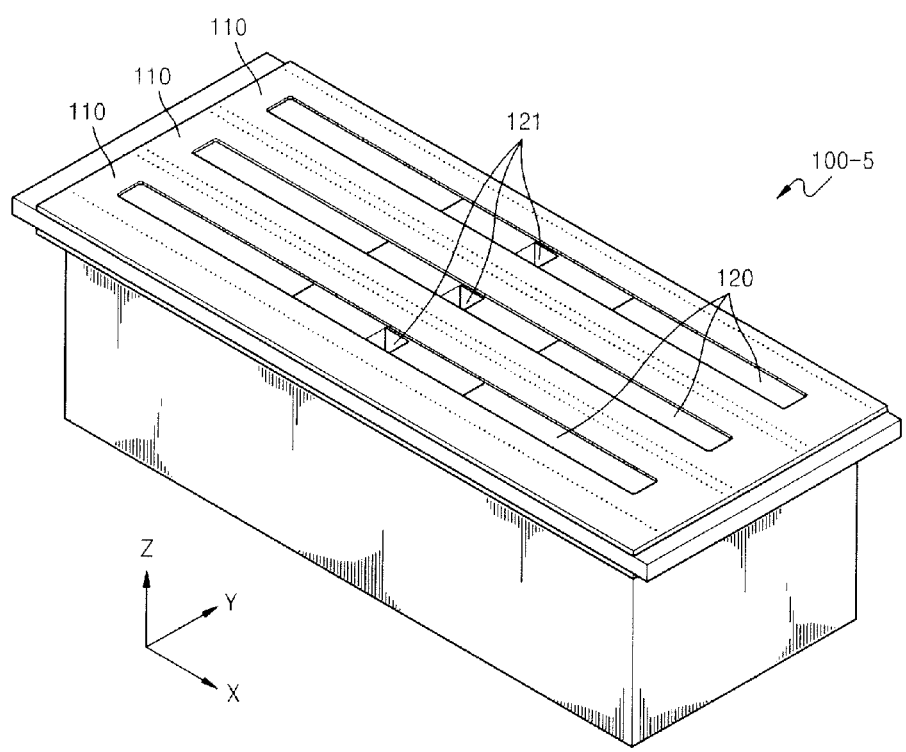
FIG. 5 is a perspective view of a deposition source of the deposition unit of FIG. 3, according to an embodiment of the present invention.
Figure 6:
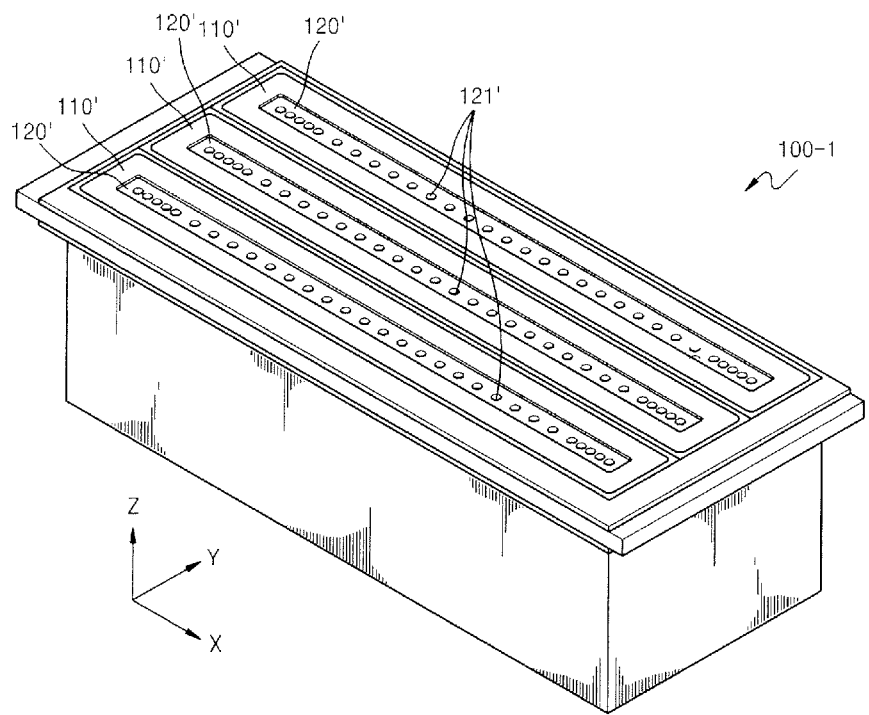
FIG. 6 is a perspective view of a deposition source of the deposition unit of FIG. 3, according to another embodiment of the present invention.
Figure 7:
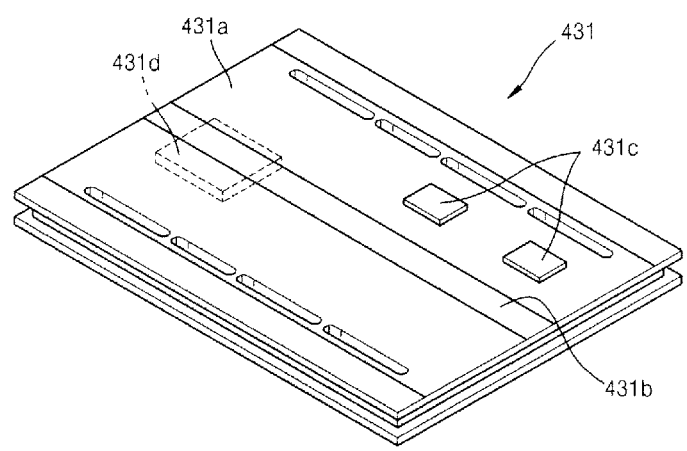
FIG. 7 is a perspective view illustrating a carrier of the deposition unit of FIG. 3, according to an embodiment of the present invention.

FIG. 3 is a schematic perspective view of the deposition unit 100 of the deposition apparatus of FIG. 1, according to an embodiment of the present invention. FIG. 4 is a schematic cross-sectional view of the deposition unit 100 of FIG. 3, according to an embodiment of the present invention. FIG. 5 is a perspective view of three deposition sources 110 of the deposition unit 100 of FIG. 3, according to an embodiment of the present invention. FIG. 6 is a perspective view of three deposition sources 110' of the deposition unit 100 of FIG. 3, according to another embodiment of the present invention. FIG. 7 is a perspective view particularly illustrating a carrier 431 of a transfer unit 430 of the deposition unit 100 of FIG. 3, according to an embodiment of the present invention.

Referring to FIGS. 3 and 4, the deposition unit 100 of the deposition apparatus includes at least one deposition assembly 100-1 and a conveyer unit 400.

Hereinafter, an overall structure of the deposition unit 100 will be described.

The chamber 101 may be of a hollow box type and accommodate the at least one deposition assembly 100-1 and the transfer unit 430. In another embodiment, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the deposition assembly 100-1 and the first conveyer unit 410 of the conveyer unit 400, and the lower housing 103 includes the second conveyer unit 420 of the conveyer unit 400. A deposition process is continuously performed while the transfer unit 430 is cyclically moving between the first conveyer unit 410 and the second conveyer unit 420.

Hereinafter, elements of the deposition assembly 100-1 are described in more detail.

The first deposition assembly 100-1 includes the deposition source 110, a deposition source nozzle unit 120, a patterning slit sheet 130, a shielding member 140, a first stage 150, a second stage 160, an interval measuring assembly 170, or the like. In this regard, all the elements illustrated in FIGS. 3 and 4 may be arranged in the chamber 101 maintained in an appropriate vacuum state. This structure is needed to achieve linearity of a deposition material.

In particular, in order to deposit a deposition material 115, which has been discharged from the deposition source 110 and passed through the deposition source nozzle unit 120 and the patterning slit sheet 130, onto the substrate 2 in a desired pattern, it is desirable to maintain the chamber in the same vacuum state as that used in a deposition method of an FMM. In addition, the temperature of the patterning slit sheet 130 should be sufficiently lower than that of the deposition source 110 because thermal expansion of the patterning slit sheet 130 is reduced or minimized when the temperature of the patterning slit sheet 130 is sufficiently low.

The substrate 2 on which the deposition material 115 is to be deposited is arranged in the chamber 101. The substrate 2 may be a substrate for a flat panel display apparatus. For example, a large substrate of 40 inches or larger, such as a mother glass, for manufacturing a plurality of flat panel displays, may be used as the substrate 2.

According to an embodiment, the deposition process may be performed by moving the substrate 2 relative to the deposition assembly 100-1.

In a comparable deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongating the FMM.

To address these problems, in the deposition assembly 100-1 according to the present embodiment, deposition may be performed while one of the deposition assembly 100-1 and the substrate 2 moves relative to the other. In one embodiment, deposition may be continuously performed while the substrate 2, which faces the deposition assembly 100-1, moves in the Y-axis direction. That is, deposition is performed in a scanning manner while the substrate 2 moves in a direction of arrow A illustrated in FIG. 3. Although the substrate 2 is illustrated as moving in the Y-axis direction in the chamber 101 in FIG. 3 when deposition is performed, the present invention is not limited thereto. For example, deposition may be performed while the deposition assembly 100-1 moves in the Y-axis direction and the substrate 2 is held in a fixed position.

Thus, in the deposition assembly 100-1, the patterning slit sheet 130 may be much smaller than an FMM used in a comparable deposition method. In other words, in the deposition assembly 100-1, deposition is continuously performed, i.e., in a scanning manner while the substrate 2 moves in the Y-axis direction. Thus, at least one of the lengths of the patterning slit sheet 130 in X-axis and Y-axis directions may be much less than a length of the substrate 2. Since the patterning slit sheet 130 may be formed to be much smaller than the FMM used in a comparable deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a comparable deposition method. In addition, this is more advantageous for manufacturing a relatively large display apparatus.

In order to perform deposition while the deposition assembly 100-1 and the substrate 2 move relative to each other as described above, the deposition assembly 100-1 and the substrate 2 may be spaced apart from each other by a certain distance. This is described below in more detail.

The deposition source 110 that contains and heats the deposition material 115 is disposed at a side opposite (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

In one embodiment, the deposition source nozzles 121 are disposed at a side of the deposition source 110 facing the substrate 2. In this regard, the deposition assemblies according to the present embodiment each may include different deposition nozzles in performing deposition for forming common layers and pattern layers. This structure will be described below in more detail.

FIG. 5 is a perspective view of deposition source nozzles for forming a pattern layer. FIG. 6 is a perspective view of deposition source nozzles for forming a common layer.

Referring to FIG. 5, the deposition assembly 100-5 includes the three deposition sources 110 and three deposition source nozzle units 120. Each deposition source nozzle unit 120 includes a deposition source nozzle 121 at a central portion thereof. The deposition material 115 that has been vaporized in the deposition source 110 passes through the deposition source nozzle unit 120 and is deposited onto the substrate 2 on which the deposition material 115 is to be deposited. The deposition source nozzle 121 is formed in the deposition source nozzle unit 120, and the three deposition sources 110 are arranged in the deposition assembly 100-5 along a scanning direction of the substrate 2. That is, a plurality of deposition source nozzles 121 may be formed in the deposition assembly 100-5 along the scanning direction of the substrate 2 (i.e., the direction the substrate 2 is moving). If the plurality of deposition source nozzles 121 are arranged in the X-axis direction (i.e., the direction perpendicular to the direction the substrate 2 is moving), distances between the respective deposition source nozzles 121 and a patterning slit 131 (see FIG. 16) are different from each other, and thus, a shadow occurs on the substrate 2 due to the deposition material 115 discharged from the deposition source nozzles 121 that are disposed far from the patterning slit 131. Thus, in the present embodiment, the deposition source nozzles 121 are formed such that only one line of the deposition source nozzles 121 is formed in the Y-axis direction in order to significantly reduce the occurrence of shadows. In addition, the deposition source nozzles 121 are arranged in the scanning direction of the substrate 2, and thus, a flux difference between the deposition source nozzles 121 may be compensated for and deposition uniformity may be maintained constant.

Although not illustrated in FIGS. 5 and 6, two of the three deposition sources 110, that is, the lateral depositions sources, may be used to deposit a host material, and the central deposition source 110 may be used to deposit a dopant material. As described above, the deposition apparatus according to the present embodiment includes both a deposition source for depositing a host material and a deposition source for depositing a dopant material, and thus, the host material and the dopant material may be co-deposited on the substrate 2. Thus, the manufacturing processes may be simplified and performed fast, and thus, a manufacturing yield of an organic light-emitting display apparatus may increase.

Referring to FIG. 6, a deposition source nozzle unit 120' is disposed at a side of the deposition source 110', and in particular, at the side of the deposition source 110' facing the substrate 2. The deposition source nozzle unit 120' includes a plurality of deposition source nozzles 121' arranged along an X-axis direction (i.e., a direction perpendicular to the scanning direction of the substrate 2). In this regard, the plurality of deposition source nozzles 121' may be arranged at equal intervals or at smaller intervals towards both ends thereof. A deposition material that has been vaporized in the deposition source 110' passes through the deposition source nozzles 121' of the deposition source nozzle unit 120' and is then deposited onto the substrate 2. By arranging the plurality of deposition source nozzles 121' along the X-axis direction (i.e., a direction perpendicular to the scanning direction of the substrate 2) so as to form a common layer, a thickness uniformity of the common layer may be improved.

In one embodiment, the patterning slit sheet 130 may be disposed between the deposition source 110 and the substrate 2. The patterning slit sheet 130 (see FIG. 16) may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., using etching. In this regard, a total number of patterning slits 131 may be higher than a total number of deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the deposition assembly 100-1 moves relative to the substrate 2.

In order for the deposition assembly 100-1 to move relative to the substrate 2, the patterning slit sheet 130 is disposed spaced apart from the substrate 2 by a certain distance.

In a comparable deposition method using an FMM, deposition is performed with the FMM in close contact with the substrate in order to prevent formation of shadows on the substrate. However, in this case, defects due to the contact between the substrate and the FMM may occur. In addition, since it is difficult to move the mask with respect to the substrate, the mask and the substrate need to be formed to have the same size. Accordingly, the mask needs to be large as the size of a display apparatus increases. However, it is difficult to form a large mask.

To address these problems, in the deposition assembly 100-1 according to the present embodiment, the patterning slit sheet 130 is formed spaced apart by a certain distance from the substrate 2 on which the deposition material is to be deposited.

According to the present embodiment, deposition may be performed while a mask that is smaller than a substrate is moved with respect to the substrate, and thus, it is easier to manufacture the mask. In addition, defects due to contact between the substrate and the mask may be prevented. In addition, since it is unnecessary to closely contact the substrate with the mask during the deposition process, the manufacturing speed may be improved.

Hereinafter, the particular disposition of each element of the upper housing 104 will be described.

Referring back to FIGS. 3 and 4, the deposition source 110 and the deposition source nozzle unit 120 are disposed on a bottom portion of the upper housing 104. Accommodation portions 104-1 are respectively formed on both sides of the deposition source 110 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be disposed between the patterning slit sheet 130 and the deposition source 110. In particular, an anode or cathode pattern is formed on an edge portion of the substrate 2 and is used as a terminal for inspecting a product or for manufacturing a product. If an organic material is applied on a region of the substrate 2, the anode or the cathode can not sufficiently perform its function. Thus, the edge portion of the substrate 2 is formed to be a non-film-forming region on which an organic material or the like is not applied. As described above, however, in the deposition apparatus, deposition is performed in a scanning manner while the substrate 2 is moved relative to the deposition apparatus, and thus, it is not easy to prevent the organic material from being deposited on the non-film-forming region of the substrate 2.

Therefore, to prevent the organic material from being deposited on the non-film-forming region of the substrate 2, in the deposition apparatus, the shielding member 140 may be disposed on the edge portion of the substrate 2. Although not particularly illustrated in FIGS. 3 and 4, the shielding member 140 may include two adjacent plates.

When the substrate 2 does not pass through the deposition assembly 100-1, the shielding member 140 screens the deposition source 110, and thus, the deposition material 115 discharged from the deposition source 110 does not reach the patterning slit sheet 130. When the substrate 2 enters the deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be easy to prevent the organic material from being deposited on the non-film-forming region of the substrate 2 without using a separate structure.

Hereinafter, the conveyer unit 400 that conveys the substrate 2, on which the deposition material 115 is to be deposited, is described in more detail. Referring to FIGS. 3, 4, and 7, the conveyer unit 400 includes the first conveyer unit 410, the second conveyer unit 420, and the transfer unit 430.

The first conveyer unit 410 conveys in an in-line manner the transfer unit 430, including the carrier 431 and an electrostatic chuck 432 attached thereto, and the substrate 2 attached to the transfer unit 430 so that a deposition material may be formed on the substrate 2 by the deposition assembly 100-1. The first conveyer unit 410 includes a coil 411, guide members 412, upper magnetically suspended bearings, side magnetically suspended bearings, and gap sensors.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached.

Hereinafter, each element of the conveyer unit 400 will be described in more detail.

The carrier 431 of the transfer unit 430 will now be described in more detail.

Referring to FIG. 7, the carrier 431 includes a main body part 431a, an LMS magnet 431b, contactless power supply (CPS) modules 431c, a power supply unit 431d, and guide grooves 431f.

The main body part 431a constitutes a base part of the carrier 431 and may be formed of a magnetic material such as iron. In this regard, due to a repulsive force between the main body part 431a and the respective upper and side magnetically suspended bearings 413 and 414, which are described below, the carrier 431 may be maintained spaced apart from the guide members 412 by a certain distance.

The guide grooves 431f may be respectively formed at both sides of the main body part 431a and each may accommodate a guide protrusion 412e of the guide member 412.

The LMS magnet 431b may be formed along a center line of the main body part 431a in a direction where the main body part 431a proceeds. The LMS magnet 431b and the coil 411, which are described below in more detail, may be combined with each other to constitute a linear motor, and the carrier 431 may be conveyed in an arrow A direction by the linear motor.

The CPS modules 431c and the power supply unit 431d may be respectively formed on both sides of the LMS magnet 431b in the main body part 431a. The power supply unit 431d includes a battery (e.g., a rechargeable battery) that provides power so that the electrostatic chuck 432 can chuck the substrate 2 and maintain the chucking state. The CPS modules 431c are wireless charging modules that charge the power supply unit 431d. In particular, the charging track 423 formed in the second conveyer unit 420, which are described below, is connected to an inverter, and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the transfer unit 430 is described in more detail.

The LMS magnet 431b of the main body part 431a and the coil 411 may be combined with each other to constitute an operation unit. In this regard, the operation unit may be a linear motor. The linear motor has a small frictional coefficient, a small position error, and a very high degree of position determination, as compared to a comparable slide guide system. As described above, the linear motor may include the coil 411 and the LMS magnet 431b. The LMS magnet 431b is linearly disposed on the carrier 431, and a plurality of the coils 411 may be disposed at an inner side of the chamber 101 by a certain distance so as to face the LMS magnet 431b. Since the LMS magnet 431b is disposed on the carrier 431 instead of the coil 411, the carrier 431 may operate without any power supplied thereto.

In this regard, the coil 411 may be formed in an atmosphere (ATM) box in an air atmosphere and the carrier 431 to which the LMS magnet 431b is attached may be moved in the chamber 101 maintained in vacuum.

The deposition assembly 100-1 of the deposition apparatus according to the present embodiment may further include the interval measuring assembly 170 and the sensor for an aligning process.

In detail, the interval measuring assembly 170 may measure an interval between the substrate 2 and the patterning slit sheet 130. In this regard, the interval measuring assembly 170 is disposed to more accurately view in the chamber 101 maintained in a vacuum during deposition. For this, the interval measuring assembly 170 may be installed in an interval measuring unit accommodation unit 171 in an atmospheric state.

Figure 8:
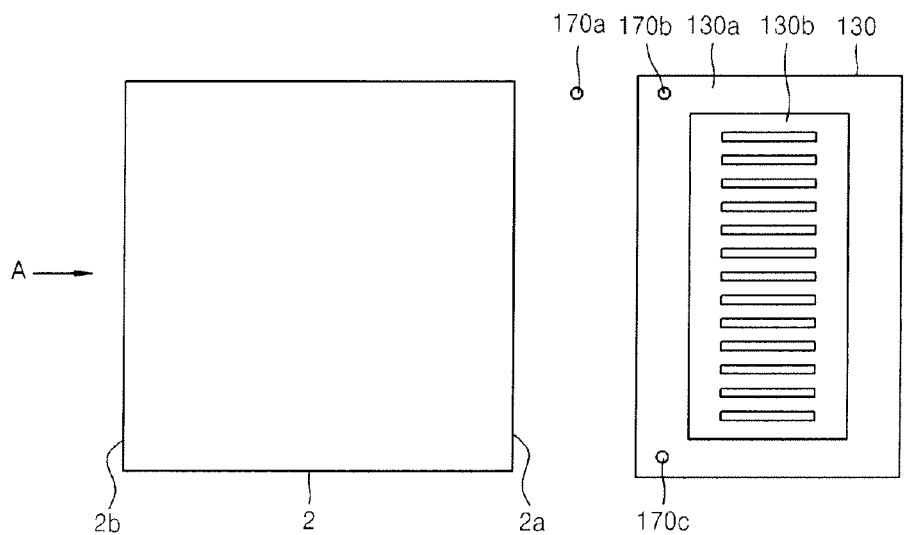
FIG. 8 is a schematic plan view illustrating an interval measuring unit and a patterning slit sheet according to an embodiment of the present invention.

FIG. 8 is a schematic plan view illustrating the interval measuring assembly 170 and the patterning slit sheet 130 of the deposition apparatus according to an embodiment of the present invention.

Referring to FIG. 8, the interval measuring assembly 170 may include a first interval measuring unit 170a, a second interval measuring unit 170b, and a third interval measuring unit 170c. However, the embodiments of the present invention are not limited thereto, and the interval measuring assembly 170 may include more than three interval measuring units.

In detail, the first interval measuring unit 170a and the second interval measuring unit 170b are arranged along a virtual first straight line, and the third interval measuring unit 170c may be arranged along a second virtual straight line that is parallel to the first straight line. The first and second straight lines may be parallel to a first direction A. That is, the first straight line along which the first interval measuring unit 170a and the second interval measuring unit 170b move may be separated away in a direction orthogonal to the second straight line, which is a path along which the third interval measuring unit 170c moves, so that the first and second straight lines may be parallel to each other.

The first interval measuring unit 170a and the second interval measuring unit 170b may move along the first straight line in the first direction A or in an opposite direction thereto. Also, the third interval measuring unit 170c may move in the first direction A along the second straight line or in the opposite direction thereto.

The first interval measuring unit 170a, the second interval measuring unit 170b, and the third interval measuring unit 170c may be arranged such that virtual lines connecting locations where the first interval measuring unit 170a, the second interval measuring unit 170b, and the third interval measuring unit 170c are disposed form a triangle. As illustrated in FIG. 8, a right triangle may be formed by virtual lines connecting locations where the first interval measuring unit 170a, the second interval measuring unit 170b, and the third interval measuring unit 170c are disposed. That is, a line connecting the locations where the first interval measuring unit 170a and the second interval measuring unit 170b are located may form a first side, and a line connecting the locations where the second interval measuring unit 170b and the third interval measuring unit 170c are located may form a second side, and a line connecting the location where the third interval measuring unit 170c and the first interval measuring unit 170a are located may form a third side, wherein the first side and the second side are perpendicular to each other, and the third side is the hypotenuse of a triangle. Accordingly, a right triangle may be formed by connecting locations where the first interval measuring unit 170a, the second interval measuring unit 170b, and the third interval measuring unit 170c are respectively disposed.

The virtual lines that connect locations where the first interval measuring unit 170a, the second interval measuring unit 170b, and the third interval measuring unit 170c are located may form a triangle also while the first interval measuring unit 170a, the second interval measuring unit 170b, and the third interval measuring unit 170c move in the first direction A or in the opposite direction thereto.

The first interval measuring unit 170a, the second interval measuring unit 170b, and the third interval measuring unit 170c may move individually. According to another embodiment of the present invention, the first interval measuring unit 170a and the third interval measuring unit 170c may move in the same direction and at the same speed.

The interval measuring units 170a, 170b, and 170c may be confocal sensors. The confocal sensors may scan an object to be measured by using laser beams that rotate at high speed by using a scanning mirror and measure a distance to the object by using fluorescent or reflected rays emitted by the laser beams. The confocal sensors may measure a distance by sensing a boundary interface between different media.

FIGS. 9 through 12 are plan views illustrating an operation of measuring an interval between the substrate 2 and the patterning slit sheet 130, by using the interval measuring unit 170 according to an embodiment of the present invention.

Figure 9:
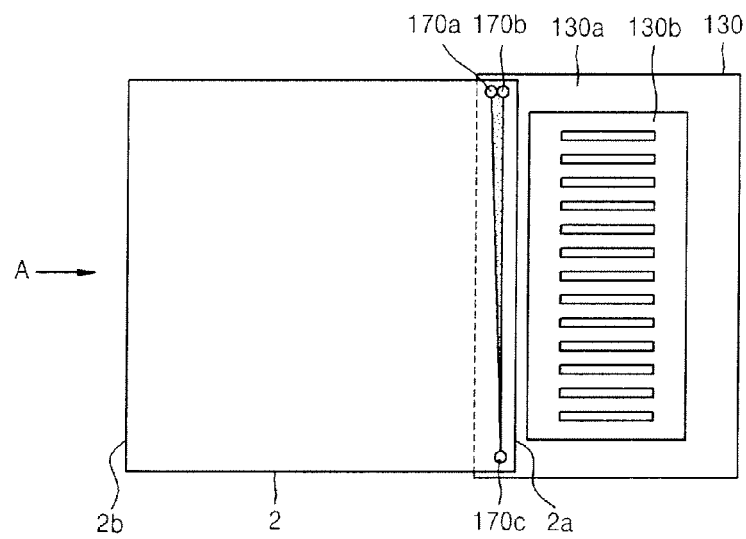
FIGS. 9 through 12 are schematic plan views illustrating an operation of measuring an interval between a substrate and a patterning slit sheet, by using the interval measuring unit according to an embodiment of the present invention.

FIG. 9 illustrates the substrate 2 transported in the first direction A such that a first side portion 2a of the substrate 2 is located to correspond to a non-patterning portion 130a. In this case, the first interval measuring unit 170a, the second interval measuring unit 170b, and the third interval measuring unit 170c are located above portions of the substrate 2 corresponding to a portion on the non-patterning portion 130a of the patterning slit sheet 130 so as to respectively measure the distances of the first interval measuring unit, the second interval measuring unit, and the third interval measuring unit with respect to the substrate 2 and the patterning slit sheet 130, thereby calculating intervals between the substrate 2 and the patterning slit sheet 130 at each of points where the first interval measuring unit 170a, the second interval measuring unit 170b, and the third interval measuring unit 170c are located. A distance between the substrate 2 and the patterning slit sheet 130 may be calculated by subtracting the distance between the interval measuring assembly 170 and the substrate 2 from the distance between the interval measuring assembly 170 and the patterning slit sheet 130.

While the substrate 2 moves in the first direction A, the first interval measuring unit 170a, the second interval measuring unit 170b, and the third interval measuring unit 170c may move at the same speed as the substrate 2.

When there is a difference in the distances between the substrate 2 and the patterning slit sheet 130 at each of the points where the first interval measuring unit 170a, the second interval measuring unit 170b, and the third interval measuring unit 170c are located, the patterning slit sheet 130 may be moved so that distances become equal to one another. This will be further described in more detail.

Figure 10:
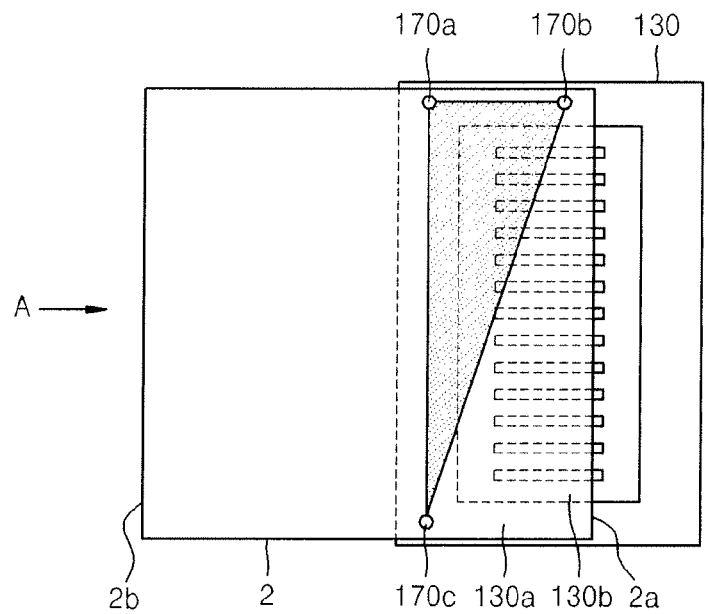

FIG. 10 illustrates the substrate 2 transported in the first direction A such that the first side portion 2a of the substrate 2 moves above the patterning unit 130b.

Referring to FIG. 10, the second interval measuring unit 170b moves along the first direction A at the same speed as the transportation speed of the substrate 2 to measure a distance to the substrate 2 and a distance to the patterning slit sheet 130, thereby calculating a distance between the substrate 2 and the patterning slit sheet 130.

In this case, the first interval measuring unit 170a and the third interval measuring unit 170c may be stationary at the non-patterning unit 130a to measure the respective distances to the substrate 2 and to the patterning slit sheet 130, thereby calculating distances between the substrate 2 and the patterning slit sheet 130 at each of the points where the first interval measuring unit 170a and the third interval measuring unit 170c are located.

When there is a difference in the distances between the substrate 2 and the patterning slit sheet 130 at each of the points where the first interval measuring unit 170a, the second interval measuring unit 170b, and the third interval measuring unit 170c are located, the patterning slit sheet 130 may be moved so that the distances become equal to one another. This will be further described in more detail.

Figure 11:
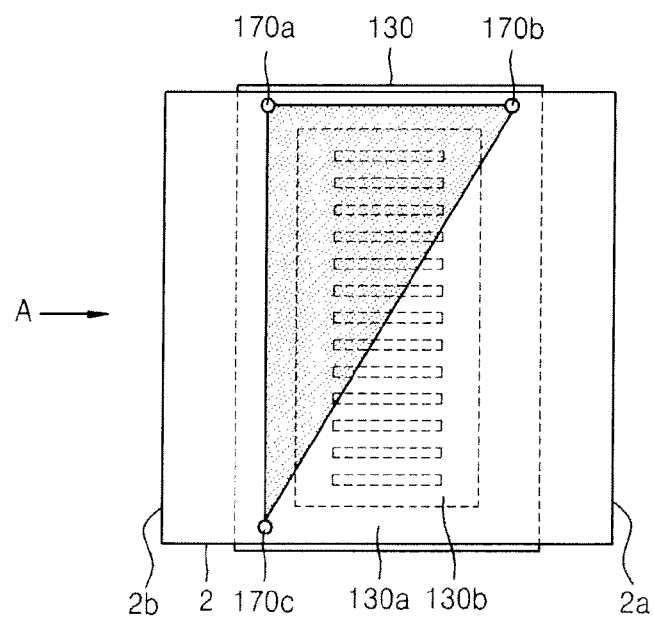

FIG. 11 illustrates the substrate 2 transported in the first direction A such that the first side portion 2a of the substrate 2 passes a portion above the patterning unit 130b so as to be also out of a portion above the non-patterning unit 130a.

In this case, while the second interval measuring unit 170b is stationary above the non-patterning unit 130a which is adjacent to the first side portion 2a of the substrate 2 with respect to the patterning unit 130b, and the first interval measuring unit 170a and the third interval measuring unit 170c are stationary above the non-patterning unit 130a which is adjacent to a second portion 2b of the substrate 2 with respect to the patterning unit 130b, each of the first interval measuring unit 170a and the third interval measuring unit 170c respectively measure distances to the substrate 2 and to the patterning slit sheet 130 to calculate distances between the substrate 2 and the patterning slit sheet 130 at their locations respectively. As described above, that is, an interval between the substrate 2 and the patterning slit sheet 130 may be calculated by subtracting the distance between the interval measuring assembly 170 and the substrate 2 from the distance between the interval measuring assembly 170 and the patterning slit sheet 130.

When there is a difference in the distances between the substrate 2 and the patterning slit sheet 130 at each of the points where the first interval measuring unit 170a, the second interval measuring unit 170b, and the third interval measuring unit 170c are located, the patterning slit sheet 130 may be moved so that the distances become equal to one another.

Figure 13:
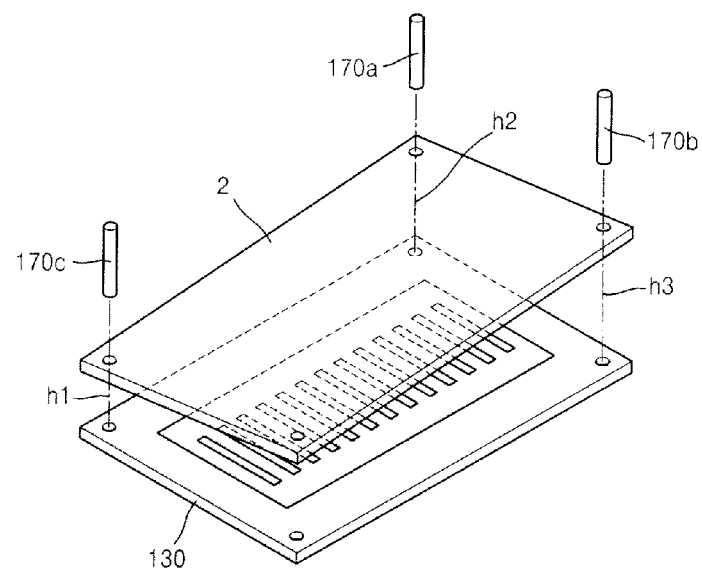
FIGS. 13 and 14 are perspective views illustrating an interval between a substrate and a patterning slit sheet, according to an embodiment of the present invention.
Figure 14:
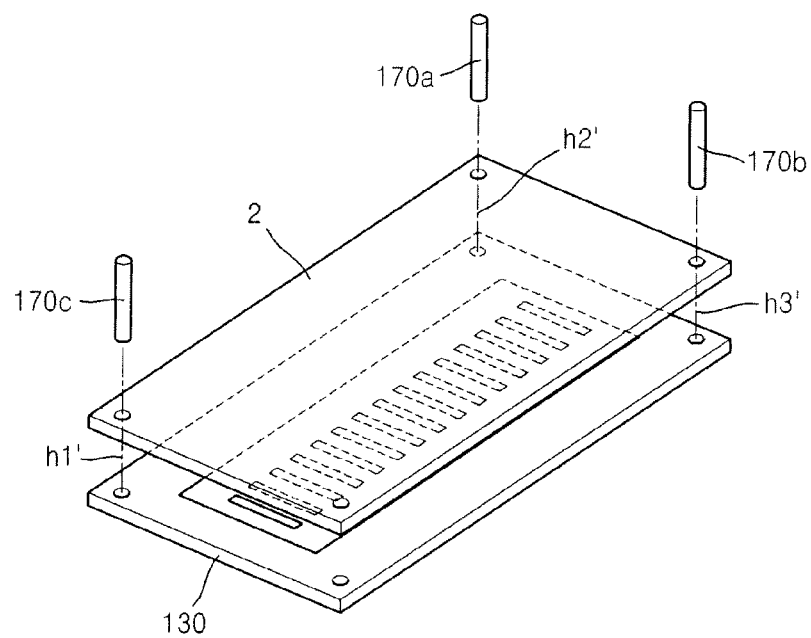

In detail, FIGS. 13 and 14 illustrate an arrangement of the substrate 2 and the patterning slit sheet 130. FIG. 13 illustrates a state before the substrate 2 and the patterning slit sheet 130 are aligned with respect to each other, and FIG. 14 illustrates a state after the substrate 2 and the patterning slit sheet 130 are aligned with respect to each other. Referring to FIG. 13, when the substrate 2 is moved to be disposed above the patterning slit sheet 130, the first interval measuring unit 170a, the second interval measuring unit 170b, and the third interval measuring unit 170c each measures the distances to the substrate 2 and the patterning slit sheet 130 so as to measure intervals h1, h2, and h3 between the substrate 2 and the patterning slit sheet 130 with respect to respective measuring points. As illustrated in FIG. 13, the intervals h1, h2, and h3 between the substrate 2 and the patterning slit sheet 130 may be different from one another. In this case, the first stage 150 and the second stage 160 may move the patterning slit sheet 130 in X, Y, and Z directions so that, as illustrated in FIG. 14, intervals h1', h2', and h3' between the substrate 2 and the patterning slit sheet 130 may be maintained uniformly.

Figure 12:
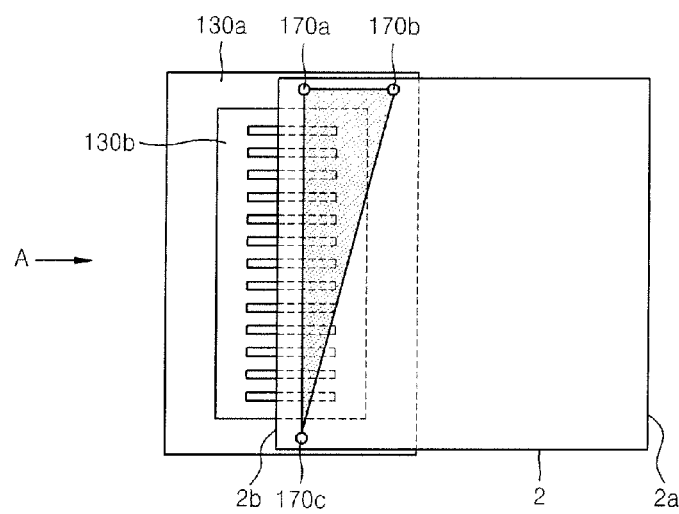

FIG. 12 illustrates a case where the substrate 2 transported in the first direction A so that a portion of the patterning slit sheet 130 is not covered by the substrate 2.

In this case, the second interval measuring unit 170b is stationary above the non-patterning unit 130a which is adjacent to the first side portion 2a of the substrate 2 with respect to the patterning unit 130b, and the first interval measuring unit 170a and the third interval measuring unit 170c move along the first direction A at the same speed as a transportation speed of the substrate 2 and each of them may respectively measure their distances from the substrate 2 and from the patterning slit sheet 130 so as to measure an interval between the substrate 2 and the patterning slit sheet 130.

When there is a difference in the distances between the substrate 2 and the patterning slit sheet 130 at each of the points where the first interval measuring unit 170a, the second interval measuring unit 170b, and the third interval measuring unit 170c are located, the patterning slit sheet 130 may be moved so that the distances become equal to one another.

Since a distance between the substrate 2 and the patterning slit sheet 130 is measurable in real time by using the interval measuring assembly 170, the substrate 2 may be aligned with the patterning slit sheet 130 in real time, whereby the position accuracy of a pattern may be significantly improved.

Then, when the substrate 2 moves along the first direction A so as to be not located on the patterning slit sheet 130 anymore, the first interval measuring unit 170a, the second interval measuring unit 170b, and the third interval measuring unit 170c may move in an opposite direction to the first direction A so that, as illustrated in FIG. 8, the first interval measuring unit 170a is not located on the patterning slit sheet 130, and the second interval measuring unit 170b and the third interval measuring unit 170c may be located on the non-patterning unit 130a.

Figure 15:
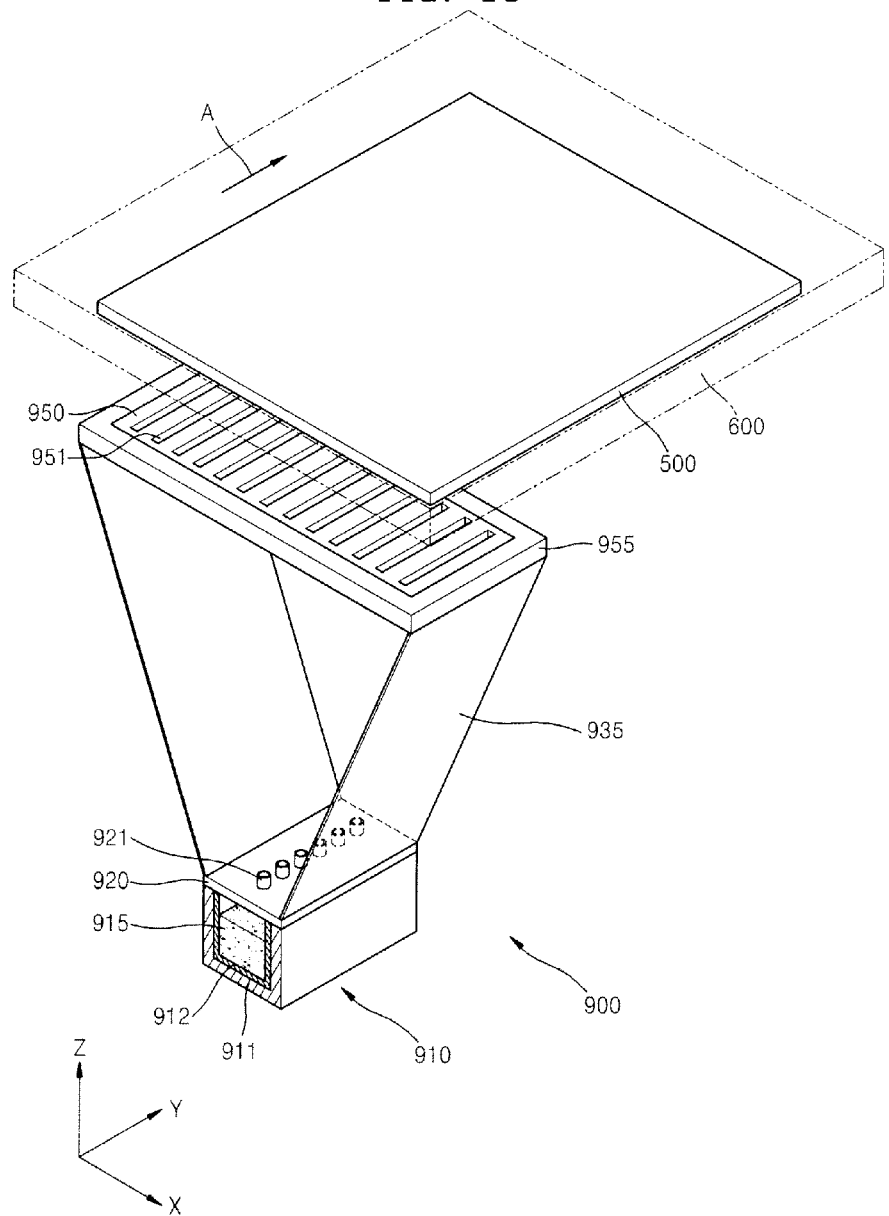
FIG. 15 illustrates a deposition assembly according to another embodiment of the present invention.

FIG. 15 is a schematic perspective view illustrating a deposition assembly 900 according to another embodiment of the present invention.

Referring to FIG. 15, the deposition assembly 900 includes a deposition source 910, a deposition source nozzle unit 920, and a patterning slit sheet 950.

The deposition source 910 includes a crucible 911 in which a deposition material 915 is filled, and a heater 912 that heats the crucible 911 to evaporate the deposition material 915 filled in the crucible 911. Meanwhile, the deposition source nozzle unit 920 is disposed on a side portion of the deposition source 910, and the deposition source nozzle unit 920 includes a plurality of deposition nozzles 921 that are arranged along the Y-axis direction. Meanwhile, a patterning slit sheet 950 and a frame 955 are further disposed between the deposition source 910 and the substrate 500, and a plurality of patterning slits 951 are formed in the patterning slit sheet 950 along a X-axis direction. In addition, the deposition source 910, the deposition nozzle unit 920, and the patterning slit sheet 950 are coupled to one another by using a connection member 935.

The current embodiment of the present invention is different from above-described embodiments in regard to the arrangement of the plurality of deposition source nozzles 921 included in the deposition source nozzle unit 920. This will be described in more detail.

The deposition source nozzle unit 920 is disposed on a side of the deposition source 910, that is, on a side in a direction from the deposition source 910 towards the substrate 500. A plurality of deposition source nozzles 921 are formed in the deposition source nozzle unit 920 in the Y-direction, that is, along a scanning direction of the substrate 500. Here, the plurality of deposition source nozzles 921 may be arranged at equal intervals. The deposition material 915 that is gasified in the deposition source 910 passes through the deposition source nozzle unit 920 towards the substrate 500 which is a substrate material to be deposited on. As a result, a plurality of deposition nozzles 921 are formed in a single deposition assembly 900-1 along the scanning direction. In another case, if a plurality of deposition source nozzles 921 are included in the X-axis direction, distances between the respective deposition source nozzles 921 and the patterning slits 951 are various, and a shadow may form by a deposition material that is emitted from those deposition source nozzles 921 that are relatively far from the patterning slits 951. Accordingly, by forming the deposition source nozzles 951 such that only one deposition source nozzle 921 is disposed in the X-axis direction as in the current embodiment of the present invention, formation of a shadow may be significantly reduced. Also, as a plurality of deposition source nozzles 921 are present in the scanning direction, even if a flux difference exists between the individual deposition source nozzles 921, the flux difference may be offset so that deposition uniformity may be maintained.

Hereinafter, a structure of an organic layer formed using the deposition apparatus described above is described in more detail.

Figure 16:
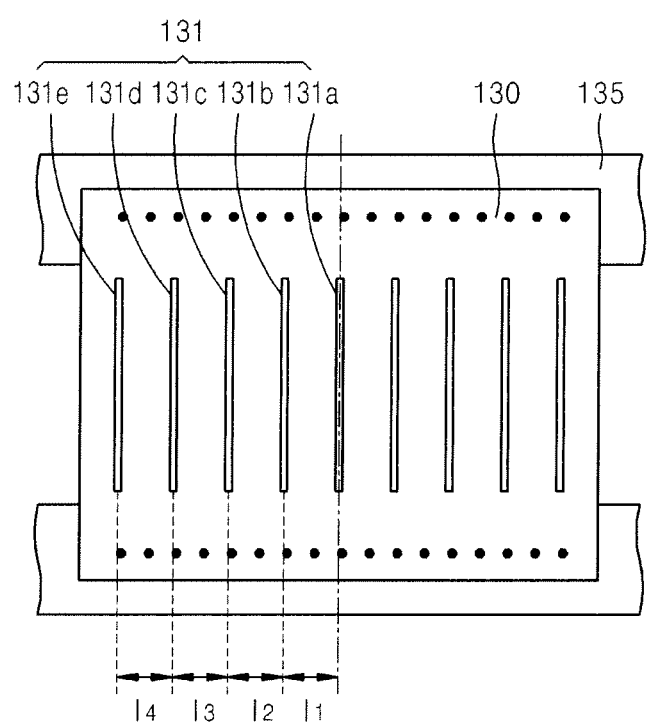
FIG. 16 is a diagram illustrating a structure in which patterning slits are formed at equal intervals in a patterning slit sheet of the deposition apparatus including the deposition unit of FIG. 3, according to an embodiment of the present invention.
Figure 17:
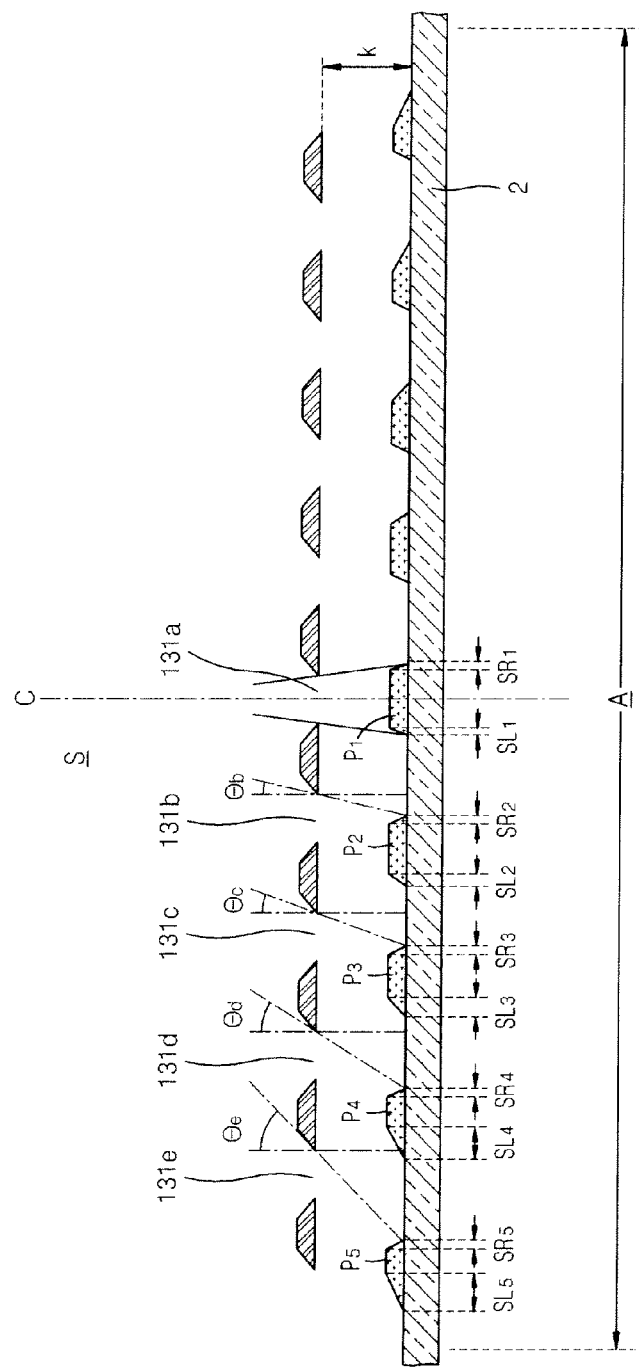
FIG. 17 is a diagram illustrating organic layers formed on a substrate by using the patterning slit sheet of FIG. 16, according to an embodiment of the present invention.

FIG. 16 is a diagram illustrating a structure in which the patterning slits 131 are arranged at equal intervals in the patterning slit sheet 130 of the deposition apparatus including the deposition unit 100 of FIG. 2, according to an embodiment of the present invention. FIG. 17 is a diagram illustrating organic layers formed on the substrate by using the patterning slit sheet 130 of FIG. 16, according to an embodiment of the present invention.

FIGS. 16 and 17 illustrate the patterning slit sheet 130 in which the patterning slits 131 are arranged at equal intervals. That is, in FIG. 16, the patterning slits 131 satisfy the following condition: $I_1=I_2=I_3=I_4$.

In this embodiment, an incident angle of a deposition material discharged along a center line C of a deposition space S is substantially a right angle with respect to the substrate. Thus, a deposition layer $P_1$ formed using the deposition material that has passed through a patterning slit 131*a* has a shadow with a reduced or minimum size, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131*e* is approximately 55°. Accordingly, the deposition material is incident at an inclination with respect to the patterning slit 131*e*, and a deposition layer $P_5$ formed using the deposition material that has passed through the patterning slit 131*e* has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, deposition layers formed using the deposition material that passes through the patterning slits disposed farther from the center line C of the deposition space S have a larger shadow size. In particular, of the shadows on both sides of the respective deposition layers, the size of the shadow at a position farther from the center line C of the deposition space S is larger than that of the other.

That is, referring to FIG. 17, the deposition layers formed on the left side of the center line C of the deposition space S have a right angle triangular shadow structure on each side of a deposited layer in which a left hypotenuse is larger than a right hypotenuse, and the deposition layers formed on the right side of the center line C of the deposition space S have a structure in which a right hypotenuse is larger than a left hypotenuse.

Also, in the deposition layers formed on the left side of the center line C of the deposition space S, the length of the left hypotenuse increases towards the left. In the deposition layers formed on the right side of the center line C of the deposition space S, the length of the right hypotenuse increases towards the right. Consequently, the deposition layers formed in the deposition space S may be formed symmetrical to each other with respect to the center line C of the deposition space S.

This structure will now be described in more detail.

The deposition material that passes through a patterning slit 131*b* passes through the patterning slit 131*b* at a critical incident angle $θ_b$, and a deposition layer $P_2$ formed using the deposition material that has passed through the patterning slit 131*b* has a left-side shadow having a size $SL_2$. Similarly, the deposition material that passes through a patterning slit 131*c* passes through the patterning slit 131*c* at a critical incident angle $θ_c$, and a deposition layer $P_3$ formed using the deposition material that has passed through the patterning slit 131*c* has a left-side shadow having a size $SL_3$. Similarly, the deposition material that passes through a patterning slit 131*d* passes through the patterning slit 131*d* at a critical incident angle $θ_d$, and a deposition layer $P_4$ formed using the deposition material that has passed through the patterning slit 131*d* has a left-side shadow having a size $SL_4$. Similarly, the deposition material that passes through the patterning slit 131*e* passes through the patterning slit 131*e* at a critical incident angle $θ_e$, and a deposition layer $P_5$ formed using the deposition material that has passed through the patterning slit 131*e* has a left-side shadow having a size $SL_5$.

In this regard, the critical incident angles satisfy the following inequality $θ_b<θ_c<θ_d<θ_e$, and thus, the sizes of the shadows of the deposition layers also satisfy the following inequality $SL_1<SL_2<SL_3<SL_4<SL_5$.

Figure 18:
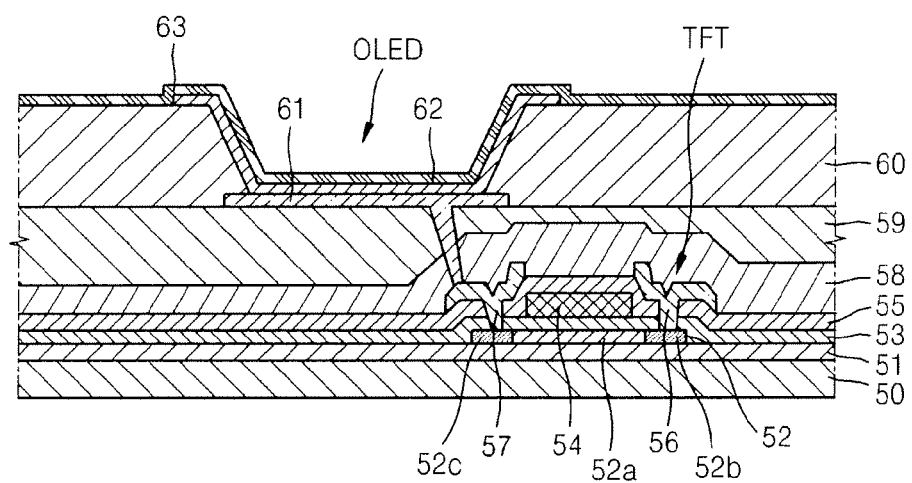
FIG. 18 is a cross-sectional view of an active matrix-type organic light-emitting display apparatus manufactured by using a deposition apparatus, according to an embodiment of the present invention.

FIG. 18 is a cross-sectional view of an active matrix-type organic light-emitting display apparatus manufactured using the deposition apparatus, according to an embodiment of the present invention.

Referring to FIG. 18, the active matrix organic light-emitting display apparatus according to the current embodiment is formed on the substrate 50. The substrate 50 may be formed of a transparent material, for example, glass, plastic, or metal. An insulating layer 51, such as a buffer layer, is formed on an entire surface of the substrate 50.

A thin film transistor (TFT), a capacitor, and an organic light-emitting diode (OLED) are disposed on the insulating layer 51, as illustrated in FIG. 17.

A semiconductor active layer 52 is formed on an upper surface of the insulating layer 51 in a set or predetermined pattern. A gate insulating layer 53 is formed to cover the semiconductor active layer 52. The semiconductor active layer 52 may include a p-type or n-type semiconductor material.

A gate electrode 54 of the TFT is formed in a region of the gate insulating layer 53 corresponding to the semiconductor active layer 52. An interlayer insulating layer 55 is formed to cover the gate electrode 54. The interlayer insulating layer 53 and the gate insulating layer 53 are etched by, for example, dry etching, to form a contact hole exposing parts of the semiconductor active layer 52.

Source/drain electrodes 56 and 57 are formed on the interlayer insulating layer 55 to contact the semiconductor active layer 52 through the contact hole. A passivation layer 58 is formed to cover the source/drain electrodes 56 and 57, and is etched to expose a part of one of the source/drain electrodes 56 and 57. An insulating layer 59 may be further formed on the passivation layer 58 so as to planarize the passivation layer 58.

In addition, the OLED displays set or predetermined image information by emitting red, green, or blue light according to an applied current. The OLED includes a first electrode 61 disposed on the passivation layer 58. The first electrode 61 is electrically connected to the exposed source/drain electrode 57 of the TFT.

A pixel-defining layer 60 is formed to cover the first electrode 61. An opening is formed in the pixel-defining layer 60, and a deposition layer 62 including an emission layer (EML) is formed in a region defined by the opening. A second electrode 63 is formed on the deposition layer 62.

The pixel-defining layer 60, which defines individual pixels, is formed of an organic material. The pixel-defining layer 60 also planarizes the surface of a region of the substrate in which the first electrode 61 is formed, and in particular, the surface of the insulating layer 59.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), and/or an electron injection layer (EIL). Non-limiting examples of suitable organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using the deposition apparatus illustrated in FIGS. 1 through 10. That is, a deposition apparatus, which includes a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein, is disposed spaced apart by a set or predetermined distance from a substrate on which the deposition material is to be deposited. In addition, the deposition material discharged from the deposition apparatus is deposited on the substrate 2 while the deposition apparatus and the substrate 2 are moved relative to each other.

After the organic layer 63 is formed, the second electrode 62 may be formed by the same deposition method as the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), indium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be a transparent electrode or a reflective electrode. When the second electrode 62 is a transparent electrode, the second electrode 62 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. When the second electrode 62 is a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as the organic layer 63 described above.

The deposition apparatuses according to the embodiments of the present invention described above may be used to form an organic layer or an inorganic layer of an organic TFT and other layers from various materials.

As described above, the one or more embodiments of the present invention provide deposition apparatuses that are suitable for use in mass producing large substrates and enable high-definition patterning, methods of manufacturing organic light-emitting display apparatuses by using the same, and organic light-emitting display apparatuses manufactured using the methods.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:
1. A method of manufacturing an organic light emitting display apparatus, the method comprising:
fixing a substrate to a transfer unit at a loading unit;
transporting the transfer unit on which the substrate is fixed in a first direction into a chamber by using a first conveyer unit that passes through the chamber;
depositing a deposition material that is emitted from a deposition assembly by moving one of the substrate or the deposition assembly relative to the other, while the deposition assembly arranged in the chamber and the substrate are separated from each other by a distance;
separating the substrate on which deposition is completed from the transfer unit at an unloading unit;
transporting the transfer unit that is separated from the substrate to the loading unit by using a second conveyer unit, wherein the depositing of the deposition material comprises measuring an interval between the substrate and the deposition assembly while the one of the substrate or the deposition assembly moves relative to the other; and
wherein the deposition assembly comprises:
a deposition source configured to discharge the deposition material;
a deposition source nozzle unit installed at a side of the deposition source and comprising a plurality of deposition source nozzles;
a patterning slit sheet facing the deposition source nozzle unit and comprising a plurality of patterning slits formed along a direction; and
an interval measuring assembly configured to move relative to the substrate and the patterning slit sheet in order to measure an interval between the substrate and the patterning slit sheet, wherein the patterning slit sheet comprises a patterning unit having a plurality of patterning slits and a non-patterning unit that surrounds the patterning unit and does not have a patterning slit, and wherein the interval measuring assembly comprises at least three interval measuring units, and the at least three interval measuring units are located on a single virtual plane, and are not arranged along a straight line.

2. The method of claim 1, wherein additional deposition assemblies are arranged in the chamber so as to perform deposition on the substrate consecutively.

3. The method of claim 1, wherein the transfer unit is circulated by the first conveyer unit and the second conveyer unit.

4. The method of claim 1, wherein one of the first conveyer unit and the second conveyer unit is arranged on top of the other.

5. The method of claim 1, wherein the patterning slit sheet of the deposition assembly is smaller than the substrate in at least one of the first direction or a second direction perpendicular to the first direction.

6. The method of claim 1, wherein the at least three interval measuring units comprise a first interval measuring unit, a second interval measuring unit, and a third interval measuring unit,
wherein virtual lines that connect the first interval measuring unit, the second interval measuring unit, and the third interval measuring unit form a triangle, and
while the first interval measuring unit, the second interval measuring unit, and the third interval measuring unit move in a first direction or in a third direction opposite the first direction, the virtual lines that connect the first interval measuring unit, the second interval measuring unit, and the third interval measuring unit form a triangle.

7. The method of claim 6, wherein the measuring of the interval comprises, when the substrate is transported in the first direction such that a side portion of the substrate is located on the non-patterning unit:
measuring a distance with respect to the substrate and a distance with respect to the patterning slit sheet while the first interval measuring unit, the second interval measuring unit, and the third interval measuring unit are located above a portion of the substrate corresponding to the non-patterning unit, so as to calculate intervals between the substrate and the patterning slit sheet at each of the locations where the first interval measuring unit, the second interval measuring unit, and the third interval measuring unit are located; and
when there is a difference in the intervals between the patterning slit sheet and the substrate at each of the positions where the first interval measuring unit, the second interval measuring unit, and the third interval measuring unit are located, moving the patterning slit sheet such that the intervals become identical.

8. The method of claim 6, wherein the measuring of an interval comprises,
when the substrate is transported in the first direction so that a side portion of the substrate passes above the patterning unit:
calculating an interval between the substrate and the patterning slit sheet by using the second interval measuring unit moving at a same speed as a transportation speed of the substrate in the first direction to measure distances of the second interval measuring unit with respect to the substrate and the patterning slit sheet; and
when there is a difference in intervals between the substrate and the patterning slit sheet at each of the positions where the first interval measuring unit, the second interval measuring unit, and the third interval measuring unit are located, moving the patterning slit sheet such that the intervals become identical.

9. The method of claim 8, wherein the first interval measuring unit and the third interval measuring unit are stationary above the non-patterning unit to measure respective distances of the first interval measuring unit and the third interval measuring unit with respect to the substrate and the patterning slit sheet to calculate intervals between the substrate and the patterning slit sheet.

10. The method of claim 6, wherein the measuring of the interval comprises, when the substrate is transported in the first direction so that a first side portion of the substrate passes above the patterning unit and the non-patterning unit to be out of the non-patterning unit:
calculating intervals between the substrate and the patterning slit sheet by measuring respective distances of the first, second, and third interval measuring units with respect to the substrate and the patterning slit sheet, the second interval unit being stationary above a portion of the non-patterning unit adjacent to a first side portion of the substrate with respect to the patterning unit, and the first interval measuring unit and the third interval measuring unit being stationary above portions of the non-patterning unit adjacent to a second side portion of the substrate opposite to the first side portion with respect to the patterning unit; and
when there is a difference in intervals between the substrate and the patterning slit sheet at each of the portions where the first interval measuring unit, the second interval measuring unit, and the third interval measuring unit are located, moving the patterning slit sheet such that the intervals become identical.

11. The method of claim 6, wherein the measuring of the interval comprises, when the substrate is transported in the first direction so that a portion of the patterning slit sheet does not correspond to the substrate:
calculating intervals between the substrate and the patterning slit sheet by measuring respective distances of the first, second, and third interval measuring units with respect to the substrate and the patterning slit sheet, the second interval unit being stationary above a portion of the non-patterning unit adjacent to a first side portion of the substrate with respect to the patterning, unit, and the first interval measuring unit and the third interval measuring moving in the first direction at a same speed as a transportation speed of the substrate; and
when there is a difference in intervals between the substrate and the patterning slit sheet at each of the portions where the first interval measuring unit, the second interval measuring unit, and the third interval measuring unit are located, moving the patterning slit sheet such that the intervals become identical.

12. The method of claim 1, wherein the plurality of deposition source nozzles forms one line along the first direction.

13. The method of claim 1, wherein the plurality of deposition source nozzles are spaced apart along a second direction perpendicular to the first direction.

* * * * *